(12) United States Patent
Chen et al.

(10) Patent No.: US 9,799,494 B2
(45) Date of Patent: Oct. 24, 2017

(54) ENERGETIC NEGATIVE ION IMPACT IONIZATION PLASMA

(71) Applicant: Tokyo Electron Limited, Tokyo (JP)

(72) Inventors: Lee Chen, Cedar Creek, TX (US); Merritt Funk, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/088,930

(22) Filed: Apr. 1, 2016

(65) Prior Publication Data

US 2016/0293386 A1 Oct. 6, 2016

Related U.S. Application Data

(60) Provisional application No. 62/142,778, filed on Apr. 3, 2015.

(51) Int. Cl.
| | | |
|---|---|---|
| *H01J 37/32* | (2006.01) | |
| *H01L 21/3065* | (2006.01) | |
| *C23C 16/515* | (2006.01) | |
| *C23C 16/517* | (2006.01) | |

(52) U.S. Cl.
CPC .. *H01J 37/32596* (2013.01); *H01J 37/32357* (2013.01); *H01J 37/32422* (2013.01); *H01J 37/32467* (2013.01); *C23C 16/515* (2013.01); *C23C 16/517* (2013.01); *H01L 21/3065* (2013.01)

(58) Field of Classification Search
CPC .......... H01J 37/32596; H01J 37/32357; H01J 37/32422; H01J 37/32467; C23C 16/515; C23C 16/517; H01L 21/3065

See application file for complete search history.

(56) References Cited

U.S. PATENT DOCUMENTS

| | | | | |
|---|---|---|---|---|
| 5,083,061 A | * | 1/1992 | Koshiishi | ............... H01J 27/08 250/423 R |
| 6,853,142 B2 | * | 2/2005 | Chistyakov | ......... C23C 14/3471 118/723 FE |

(Continued)

FOREIGN PATENT DOCUMENTS

| | | |
|---|---|---|
| EP | 2479782 A1 | 5/2007 |
| TW | I358764 B | 2/2012 |

*Primary Examiner* — Anita Alanko
(74) *Attorney, Agent, or Firm* — Wood Herron & Evans LLP

(57) ABSTRACT

A processing method and system are provided for processing a substrate with a plasma in the presence of an electronegative gas. A processing gas is injected into a processing chamber. The gas includes a high electron affinity gas species. A surface is provided in the plasma chamber onto which the gas species has a tendency to chemisorb. The gas species is exposed to the surface, chemisorbed onto it, and the surface is exposed to energy that causes negative ions of the chemisorbed gas species, that interact in the plasma to release secondary electrons. A neutralizer grid may be provided to separate from the chamber a second chamber in which forms a low energy secondary plasma for processing the substrate that is dense in electrons and contains high energy neutrals of the gas species and high energy positive ions of processing gas. Pulsed energy may be used to excite plasma or bias the substrate. A hollow cathode source is also provided.

28 Claims, 4 Drawing Sheets

(56) References Cited

U.S. PATENT DOCUMENTS

| | | | | |
|---|---|---|---|---|
| 7,871,532 B2* | 1/2011 | Shimizu | ............ | H01J 37/32477 |
| | | | | 216/67 |
| 2003/0010747 A1* | 1/2003 | Stollenwerk | ...... | H01J 37/32055 |
| | | | | 216/2 |
| 2007/0193975 A1 | 8/2007 | Wilson | | |
| 2009/0289179 A1* | 11/2009 | Chen | ................. | H01J 37/32357 |
| | | | | 250/251 |
| 2010/0093186 A1* | 4/2010 | Kobayashi | .......... | H01L 21/0214 |
| | | | | 438/772 |
| 2011/0174606 A1* | 7/2011 | Funk | ................. | H01J 37/32009 |
| | | | | 204/164 |
| 2011/0272097 A1 | 11/2011 | Koshiishi et al. | | |
| 2011/0281438 A1 | 11/2011 | Lee et al. | | |
| 2013/0059448 A1* | 3/2013 | Marakhtanov | .... | H01J 37/32091 |
| | | | | 438/711 |
| 2014/0213062 A1* | 7/2014 | Shimizu | .............. | H01L 21/0332 |
| | | | | 438/719 |
| 2015/0041432 A1* | 2/2015 | Chen | ................... | H01J 37/3233 |
| | | | | 216/66 |
| 2015/0252478 A1* | 9/2015 | Dickey | ............. | H01J 37/32357 |
| | | | | 427/569 |

* cited by examiner

ENERGETIC NEGATIVE ION IMPACT IONIZATION PLASMA

CROSS-REFERENCE TO RELATED APPLICATION

Pursuant to 37 C.F.R. §1.78(a)(4), the present application claims the benefit of and priority to Provisional Application No. 62/142,778 filed on Apr. 3, 2015, and entitled ENERGETIC NEGATIVE ION IMPACT IONIZATION PLASMA, which is expressly incorporated herein by reference.

FIELD OF THE INVENTION

The invention relates to a method and system for treating a substrate and, more particularly, to a method and system for processing of a substrate with a plasma that is formed in part with an electro-negative gas.

BACKGROUND OF THE INVENTION

During semiconductor processing, plasma is often utilized to assist etching processes by facilitating the anisotropic removal of material along fine lines or within vias or contacts patterned on a semiconductor substrate. Examples of such plasma assisted etching include, for example, reactive ion etching ("RIE"), which is in essence an ion activated chemical etching process.

Although RIE has been in use for decades, its maturity is accompanied by several negative features, including: (a) broad ion energy distribution ("IED"); (b) various charge-induced side effects; and (c) feature-shape loading effects (i.e., micro-loading). Particularly, a broad IED contains ions having either too little, or too much, energy to be useful. Further, overly energetic ions are susceptible to causing semiconductor substrate damage. Additionally, broad IED makes it difficult to selectively activate a desired chemical reactions, where side reactions are often triggered by ions of sub-optimal, undesired energy.

Further, and over the course of the etching process, positive charge buildup on the semiconductor substrate may occur and repels ions that would otherwise be incident onto the semiconductor substrate. Alternatively, the charge buildup may produce local charge differences that affect currents on the substrate surface. Charge buildup may be due, in part, to the RF energy used to produce a negative bias on an otherwise non-conductive substrate used to attract positive ions from the plasma. Such RF frequencies are typically too high to allow a positive potential or near-neutral potential to exist for a sufficient amount of time to attract electrons for neutralizing the accumulated positive charges. Still further, non-uniform accumulation of charge across the surface of the substrate may create potential differences that may lead to currents on the semiconductor substrate that may very well damage the devices being formed.

One known, conventional approach to addressing these problems has been to utilize neutral beam processing. A true neutral beam process takes place essentially without any neutral thermal species participating as the reactant, additive, and/or etchant. Instead, the process at the substrate is activated by the kinetic energy of incident, directional, and energetic neutral species.

While neutral beam processes are not affected by flux-angle variation associated with the thermal species as in RIE, the use of neutrals has lead to absence of micro-loading efficiency. This lack of micro-loading results in a maximum etching efficiency of unity, in which one incident neutral nominally prompts only one etching reaction. Comparatively, in a RIE process the abundant thermal neutral etchant species may all participate in etching so that activation by one energetic incident ion may achieve an etch efficiency of 10, 100, and even 1000.

In plasma processing of substrates, particularly in chemical etching systems and other etching systems but also in some deposition systems, electro-negative gas is added to the processing gas. But the desired beneficial effects for which the electro-negative gas is used have been difficult to fully realize. Such desired beneficial effects include the production of appropriately energetic electrons, the production of negative ions and neutral species of the electro-negative gas, and the enhancement of fast positive ions for treatment of the substrate and for the activation of chemical reactions for processing the substrate.

For processing substrates having current high aspect ratio devices, generally a high energy flux of electrons, e.g., greater than 30 eV, is necessary. This energy level, and higher, reduce differential charging and minimize shading effects of the devices. Furthermore, the processing system must achieve high density plasmas ($n_e$) while controlling polymerization. While high RF sheath voltage is needed for creating and delivering energetic ions to the substrate, the RF sheath voltage must be sufficiently low so that energetic electrons may be dumped onto the wafer surface.

Thus, there remains a need for a system that is configured to generate an ultra high density plasma without losing energetic electrons to trapping so as to dump the energetic electrons as the electrons are produced.

SUMMARY OF THE INVENTION

The present invention overcomes the foregoing problems and other shortcomings and drawbacks of the prior art. While the present invention will be described in connection with certain embodiments, it will be understood that the present invention is not limited to these embodiments. To the contrary, this invention includes all alternatives, modifications, and equivalents as may be included within the spirit and scope of the present invention.

According to principles of the present invention, a substrate with a plasma in the presence of an electro-negative gas having a high electron affinity gas species in the plasma chamber and exposing the high electron affinity gas species in the plasma chamber to a surface onto which the high electron affinity gas species has a tendency to chemisorb. The surface is then exposed to energy that causes the emission of negative ions of chemisorbed high electron affinity gas species into the plasma. The emitted negative ions may further produce secondary electrons when interacting with the plasma. The secondary electrons enhance the processing of the substrate. The exposing of the surface to energy may be accomplished by exposing of the surface to the plasma while applying a time average negative potential on the surface.

In certain embodiments of the invention, the plasma may be ignited by applying a pulsed RF signal to an electrode operably coupled to the plasma chamber. In other embodiments, a pulsed voltage to the substrate alternates the bias of the substrate between a negative bias voltage level and a less negative or positive bias voltage level.

In certain embodiments of the invention, a pulsed DC bias is applied to a substrate positioned on a substrate support in the processing chamber, and the substrate is periodically biased between first and second bias levels, the first bias level being more negative than the second bias level, wherein the substrate and substrate support, when biased at the first bias level, attracts mono-energetic positive ions from the plasma toward the substrate and operable to enhance a selected chemical etch process at a surface of the substrate.

In some embodiments of the invention, a secondary plasma is energized in a portion of the chamber, or in a separate sub-chamber between the plasma and the substrate with the emitted energized electrons produced by the emitted negative ions. In further embodiments of the invention, a processing system is provided that includes a first plasma chamber configured to contain a first plasma and having a gas source coupled thereto for injecting a process gas and a high electron affinity species into the first plasma chamber.

In some embodiments, secondary electron source is disposed within the first plasma chamber that includes a surface that has a tendency to chemisorb the high electron affinity species, which in turn, has a tendency to chemisorb onto that surface. A power source is provided to energize the surface, and may be coupled to the surface to supply a negative time-average potential to the secondary electron source to attract positive ions from the plasma to energize the surface. The energizing of the surface is effective to emit negative ions of chemisorbed high electron affinity species. In certain embodiments of the invention, a second plasma chamber is provided in fluid communication with the first plasma chamber. A neutralizer may be positioned between the first plasma chamber and the second plasma chamber. The neutralizer may have a plurality of openings therein configured to permit energetic electrons to pass while the negative ions impact the neutralizer to release an energetic electron.

In certain embodiments, the surface of the secondary electron source is aluminum, while the high electron affinity species is oxygen gas and the neutralizer comprises silicon. In other embodiments, the surface of the secondary electron source may be doped-silicon, while the high electron affinity species includes at least one of fluorine gas, chlorine gas, bromine gas, tetrachlorosilane, and tetrafluorosilane, and the neutralizer comprises silicon. Other gases and surface materials are contemplated.

In still further embodiments, a hollow cathode plasma source is provided for use in generating a high density plasma that has a wall configured to surround a plasma space in the chamber that includes the surface of the secondary electron source.

These and other embodiments of the invention will be readily apparent from the following detailed description of the invention.

BRIEF DESCRIPTION OF THE FIGURES

The accompanying drawings, which are incorporated in and constitute a part of this specification, illustrate embodiments of the present invention and, together with a general description of the invention given above, and the detailed description of the embodiments given below, serve to explain the principles of the present invention.

DETAILED DESCRIPTION

In the following description, to facilitate a thorough understanding of the embodiments of the present invention, and for purposes of explanation and not limitation, specific details are set forth, such as a particular geometry of a plasma processing system and various descriptions of the system components. However, it should be understood that the present invention may be practiced with other embodiments that depart from these specific details. Nonetheless, it should be appreciated that, contained within the description are features which, notwithstanding the inventive nature of the general concepts being explained, are also of an inventive nature.

Figure 1:
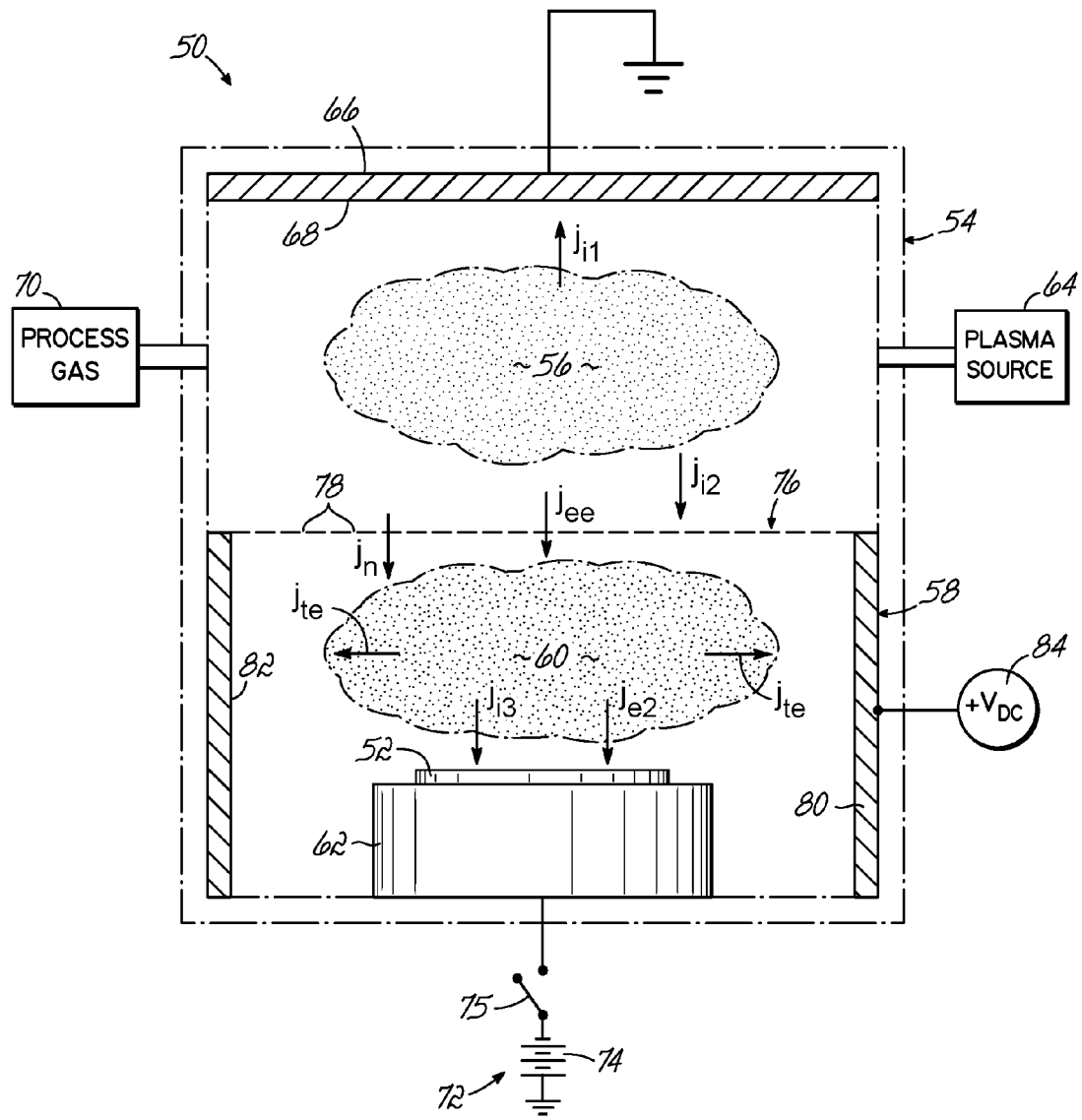
FIG. 1 illustrates a schematic view of a chemical processing system in accordance with one embodiment of the present invention.
Figure 2:
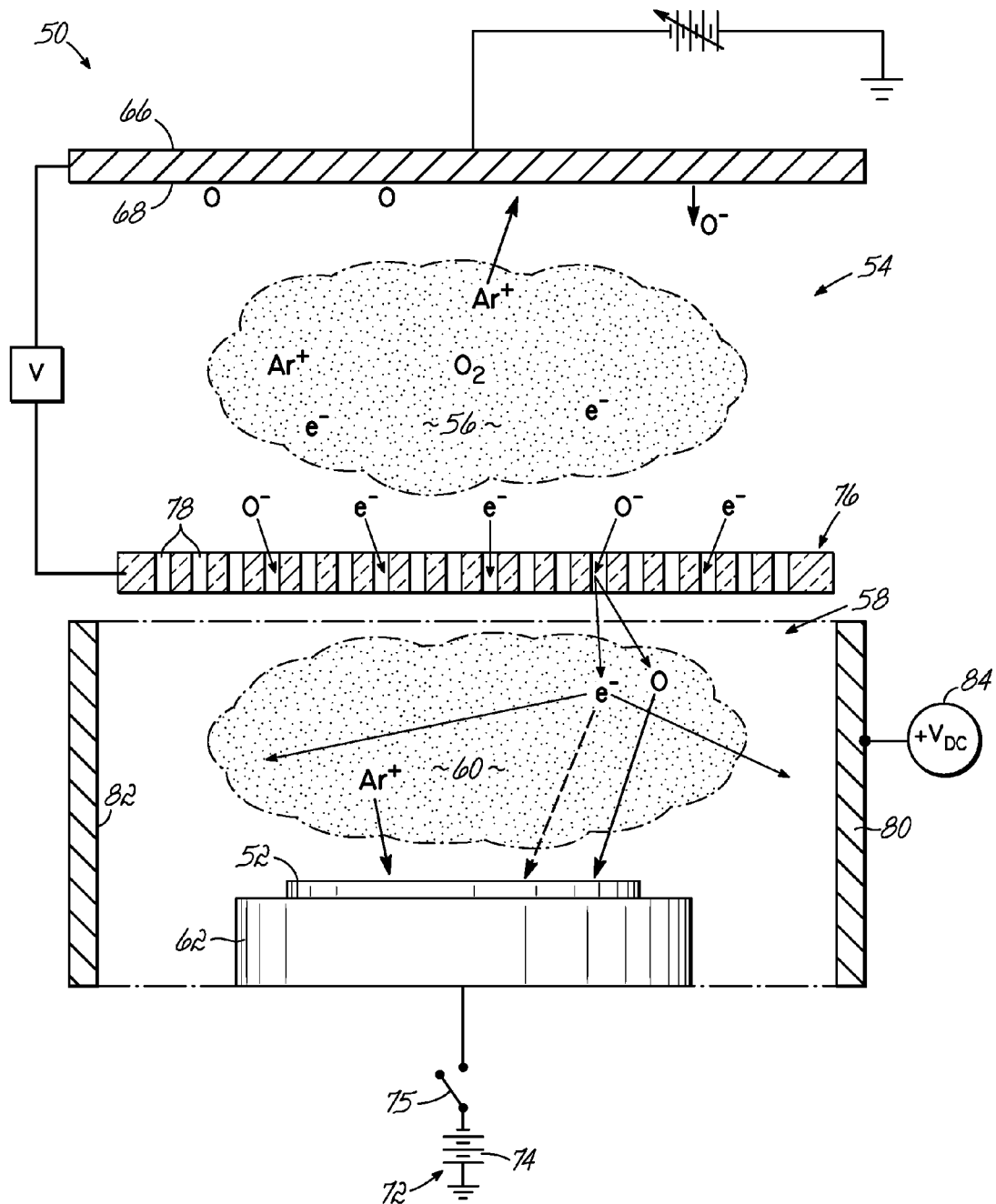
FIG. 2 is an enlarged, schematic view of the chemical processing system of FIG. 1, which is not to scale but illustrating a method of using the chemical processing system in accordance with one embodiment of the present invention.

Referring now to the figures, and in particular to FIG. 1, a chemical processing system 50 according to one embodiment of the present invention is described in detail. FIG. 2 includes an enlarged schematic of the chemical processing system 50, which is not to scale. The chemical processing system 50, as shown, is configured to perform space-charge neutralized neutral beam activated chemical processing of a substrate 52. In that regard, the chemical processing system 50 includes a first plasma chamber 54 configured to form a first plasma 56 at a first plasma potential, $V_{p,1}$, and a second plasma chamber 58 configured to form a second plasma 60 at a second plasma potential, $V_{p,2}$, that is greater than $V_{p,1}$. The first plasma 56 may be formed by coupling power, such as direct current ("DC") power or radio frequency ("RF") power, into an ionizable gas injected into the first plasma chamber 54 from a process gas source 70. However, power may be supplied by appropriate voltage source so long as the conductive surface 68 has a negative time-average potential. The second plasma 60 may be formed using electron flux (e.g., energetic electron ("ee") current, $j_{ee}$) from the first plasma 56. The chemical processing system 50 further comprises a substrate holder 62 that is configured to receive the substrate 52 thereon so as to expose the substrate 52 to the second plasma 60 at the $V_{p,2}$.

The substrate holder 62 may be further configured to apply a direct current ("DC") ground or floating ground to the substrate 52. For example, the substrate holder 62 may include an electrode incorporated therein, or at least partially comprising the substrate holder 62, that may be biased by a DC-pulse from a DC pulse generator 72, such as is described in greater detail in U.S. application Ser. No. 13/837,391, entitled DC PULSE ETCHER. In other words, the electrode may be grounded through a negative DC voltage source 74 via, for example, a relay circuit 75.

The first plasma chamber 54 includes a plasma source 64 configured to ignite and maintain the first plasma 56. The first plasma 56 may be heated by any conventional plasma source including, for example, an inductively coupled plasma ("ICP") source, a transformer coupled plasma ("TCP") source, a capacitively coupled plasma ("CCP") source, an electron cyclotron resonance ("ECR") source, a helicon wave source, a surface wave plasma ("SWP") source, etc. While the first plasma 56 may be heated by any plasma source, it is desired that the first plasma 56 is heated by a method that produces a reduced or minimum fluctuation in its plasma potential, $V_{p,1}$. One suitable plasma source for this purpose is the ICP source, which is operable by practical techniques for producing the reduced or minimum $V_{p,1}$ fluctuation.

The first plasma chamber 54 further includes a DC conductive electrode 66 having a conductive surface 68 in contact with the first plasma 56. The DC conductive ground electrode 66 is coupled to DC ground and operable as an ion sink driven by the first plasma 56 at the first plasma potential, $V_{p,1}$.

Although not necessary, it is desirable for the conductive surface 68 to have relatively large surface area for contact with the first plasma 56. The surface area of the conductive surface 68 is indirectly proportional to $V_{p,1}$. For example, the surface area may be greater than any other surface area in contact with the first plasma 56 and, indeed, the surface area may be greater than the total sum of all other conductive surfaces that are in contact with the first plasma 56. Alternatively, the conductive surface 68 of the DC conductive ground electrode 66 may be the only conductive surface in contact with the first plasma 56. The DC conductive ground electrode 66 may offer the lowest impedance path to ground.

In accordance with the particular illustrative embodiment shown in FIGS. 1 and 2, the DC conductive ground electrode 66 may be constructed from an aluminum cathode, as explained in detail below, and is involved with the chemical process according to one embodiment of the present invention.

The process gas system 70 injects the least one process gas into the first plasma chamber 54, which may include an inert gas, conventionally argon, which is ignited into the first plasma 56. In accordance with embodiments of the present invention, the process gas further includes at least a trace amount of a high electron affinity species, M2. The electron affinity species is selected to chemisorb or dissociatively chemisorb onto the conductive surface 68 of the cathode ground electrode 66, which may be aluminum. For example, oxygen gas, $O_2$, may be selected for use with an aluminum cathode ground electrode 66. While the oxygen gas content of the process gas should not be limited to any particular concentration, the oxygen gas content generally may range from about 1% to about 99% by volume, for example, from about 1% to about 25%, or from about 1% to about 10%.

Plasma ignition within the first plasma chamber 54 causes the ionization of argon gas, $Ar^+$ by releasing electrons, $e^-$. Meanwhile, the oxygen gas, having a high affinity for the aluminum cathode ground electrode 66, will dissociate and chemisorb onto the conductive surface 68, increasing the secondary ion yield of the aluminum cathode ground electrode 66. For achieving this increase in secondary ion yield, the chemisorb oxygen atoms on the conductive surface 68 remain on the aluminum surface until the bond is disrupted by radiation, which may be in the form of a photon, positive ion bombardment, and RF electrode emitted energetic-γ-electron bombardment, for example.

As illustrated in FIG. 1, and more particularly in FIG. 2, a flux of argon ions (e.g., a first ion current, $j_{i1}$,) is attracted toward the aluminum cathode ground electrode 66. When the argon ion impacts the aluminum cathode ground electrode 66, a negative ion is emitted from the same, which in the instant embodiment is an oxygen ion, $O^-$. Once within the first plasma 56, the energetic oxygen ions (i.e., fastO$^-$) react with non-ionized, thermal argon to further fuel the plasma 56 and generate ion secondary electron emissions via the reaction provided below:

fastO$^-$+Ar→fastAr$^+$+2$e^-$+fastO

Ion secondary electron emission as provided by the above reaction for a 1% oxygen gas content in the process gas may lead to a five- to ten-fold increase in number of electrons (up to about $1\times10^{12}$) as compared to the number of electrons produced in a conventional plasma comprised only of argon gas. Said another way, due to the secondary electron emissions noted above, the energetic electron flux (or electron current, $j_{ee}$) from the first plasma 56 to the second plasma 60 may be much greater than the flux of argon ions (e.g., a first ion current, $j_{i1}$) attracted toward the aluminum cathode ground electrode 66, i.e., $j_{i1} < j_{ee}$.

At least a portion of the negative ions, $O^-$, will be drawn toward the second plasma chamber 58. In that regard, the first and second plasma chambers 54, 58 are separated by a neutralizer 76 that is driven by an electric field created by the difference in plasma potential between the first and second plasma chambers 54, 58, $\Delta V=V_{p,2}-V_{p,1}$. The neutralizer 76 may be may be constructed from an insulator material, such as quartz, or a dielectric coated conductive material that is electrically floating and has a high RF impedance to ground.

The neutralizer 76 includes a plurality of openings 78 (FIG. 2) extending therethrough, wherein each opening of the plurality 78 is shaped so as to permit the passage of the energetic electron flux, $j_{ee}$, from the first plasma chamber 54 to the second plasma chamber 58. The total area of the openings of the plurality 78 may be adjusted with respect to the conductive surface 68 of the aluminum cathode ground electrode 66 to ensure a relatively large potential difference, $\Delta V$, while minimizing reverse ion current flux from the second plasma 60 to the first plasma 56. The total area further ensures a sufficient ion energy for ions striking the substrate 52.

The openings of the plurality 78 may be fabricated by e-beam drilling techniques or other similar processes, and may be, in some embodiments, about 1 mm in diameter and 20 mm in height.

While the diameter of the openings of the plurality 78 permits passage of the energetic electron flux, the diameter is generally no greater than the mean-free-path ("mfp") of the $O^-$ flux. As a result, $O^-$ entering the neutralizer 76 will impact a wall of the neutralizer 76 and release an electron. The released electron further contributes to the energetic electron flux, $j_{ee}$, and introduces a flux of neutral oxygen atoms, $j_n$, into the second plasma chamber 58.

Thus, the total energetic electron flux, $j_{ee}$, into the second plasma chamber 58 is much greater in the chemical processing system 50 according to this first embodiment than the energetic electron flux produced by a conventional, argon-based plasma process. This total $j_{ee}$ is also configured to initiate and sustain the second plasma 60 within the second plasma chamber 58 at lower potential differences, $\Delta V$, as compared to the known, conventional systems.

Resultantly, the chemical processing system 50 and the method of use as described herein, provides a high density plasma (increased $n_e$) while reducing the RF sheath potential, which, in turn, reduces the trapping potential of the thermal electrons and increases the electron dump into high aspect ratio features in the substrate 52.

Turning now to the second plasma chamber 58 and generation of the mono-energetic space-charged neutralized beam, the second plasma chamber 58 includes a DC conductive bias electrode 80 having a conductive surface 82 thereon and electrically coupled DC voltage source 84 is in contact with the second plasma 60. The conductive bias electrode 80 is configured to minimize or reduce fluctuations in $\Delta V$. In use, the DC voltage source 84 is configured to bias the DC conductive bias electrode 80 at a positive DC voltage (+VDC), which causes the second plasma potential, $V_{p,2}$ to be driven, and increased, by the voltage source (+VDC). While one DC conductive bias electrode 80 is shown in FIG. 1, the chemical processing system 50 may includes additional DC conductive bias electrodes if necessary or desired.

Thermal electrons (" $t_e$ ") may be generated within the second plasma chamber 58 when the second plasma 60 is ionized by the incoming energetic electron flux (or electron current $j_{ee}$) or when at least some of the energetic electrons, experience a loss of energy. Because of Debye shielding, a thermal electrons diffuse toward the DC conductive bias electrode 80 as a thermal electron current, $j_{te}$, and generate a quiescent plasma zone proximate the electrode 80.

While the thermal electrons are diffusing toward the DC conductive bias electrode 80, a second population of ions, of for example energetic or "fast" positive argon ions, is formed by the second plasma 60 and is directed to the substrate 52 as ion current, $j_{i3}$. These ions, along with the energetic electrons and neutral atoms of the electro-negative gas, participate in the chemical reaction, deposition, and/or etching at the substrate 52.

The chemical etching process at the substrate 52 is activated by the kinetic energy of the incident, directionally energetic neutral species, such as the flux of neutral oxygen atoms, $i_n$, described above. In some embodiments, the reactive neutral species may also serve as the reactants or etchants.

In using the chemical processing system 50 in accordance with one embodiment of the present invention, at a particular time interval, such as in accordance with a desired waveform, the relay circuit 75 coupled to the substrate holder 62 may be switched so as to apply a pulsed DC bias to the substrate 52. For example, a pulsed negative bias may be applied to the substrate 52 during which positive ions are drawn toward the substrate 52. Pulsed periods of less negative bias (even positive bias) applied to the substrate 52 between the intervals of negative bias draws at least a portion of the energetic electrons from the second plasma 60 toward the substrate 52. As a result, the DC pulse bias achieves a mono-energetic ion excitation of the substrate 52 during the negative bias and an energetic electron dump via a more positive bias onto the substrate 52 to neutralize positive charge accumulation on the substrate 52.

In other embodiments of the present invention, not specifically shown herein, an RF voltage source may be electrically coupled to the substrate holder 62 and is operable to apply an RF energy pulse that draws a portion of the second plasma 60 toward the substrate. The particle balance throughout the plasma 60 drawn toward the substrate 52 enforces an equal number of electrons (e.g., electron current, $j_{e2}$), ions (e.g., ion current, $j_{i3}$), as well as the neutral species (e.g., neutral current, $i_n$) to impact the substrate 52. This charge balance manifests as a space-charge neutralized neutral beam directed to substrate 52 configured to activate a chemical process at the substrate 52.

Figure 3:
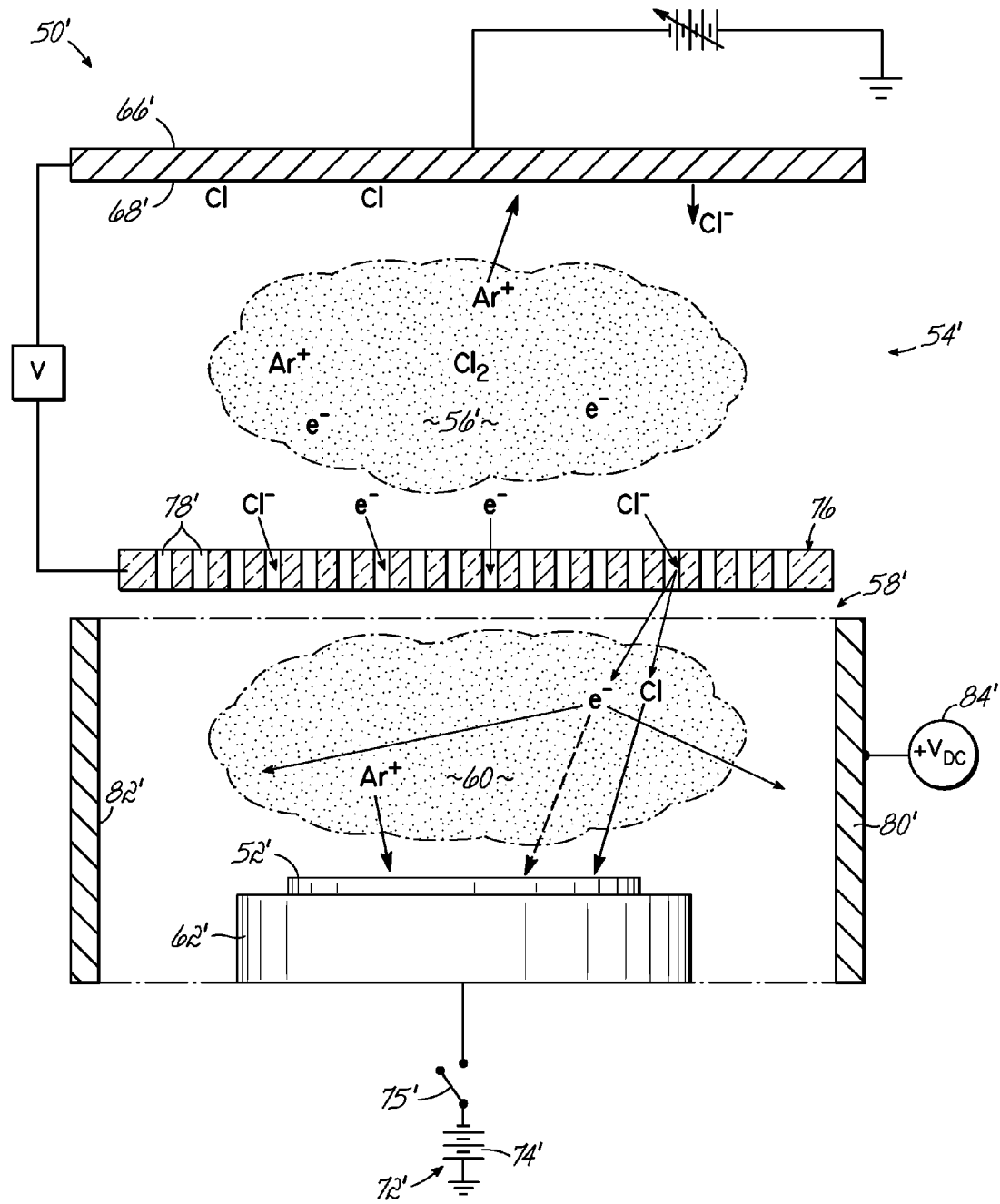
FIG. 3 is an enlarged, schematic view of the chemical processing system of FIG. 1 that is not to scale but illustrating a method of using the chemical processing system in accordance with another embodiment of the present invention.

FIG. 3 illustrates another chemical processing system 50' in accordance with another embodiment of the present invention. For illustrative convenience, like reference numerals having primes thereafter designate corresponding components of the embodiments.

According to this particular embodiment, the process gas system 70 (FIG. 1) includes argon gas as well as a high electron affinity species. While the high electron affinity specie illustrated herein is diatomic chlorine gas, it would be understood that other gases may also be used, including, for example, fluorine gas ($F_2$), bromine gas ($Br_2$), tetrachlorosilane ($SiCl_4$), and tetrafluorosilane ($SiF_4$), although chlorine gas ($Cl_2$) is expressly described herein. While the argon gas is ionized into the plasma 56', the diatomic chlorine gas dissociatively chemisorbs onto the conductive surface 68' of the DC conductive electrode 66', which in accordance with this embodiment is constructed, at least in part, from silicon. Argon ions, attracted toward the silicon cathode ground electrode 66', impact the conductive surface 68' so that the surface 68' emits a negative ion, herein, an energetic chloride ion, $Cl^-$.

Once the energetic chloride ion (i.e., fastCl$^-$) is in the first plasma 56', it will react with non-ionized thermal argon gas to further fuel the first plasma 56 and generated ion secondary electron emissions via the reaction provided below:

fastCl$^-$+Ar→fastAr$^+$+2$e^-$+fastCl

Use of about 1% chlorine gas has been used to increase the plasma density (i.e., number of electrons) as compared to conventional argon gas plasma.

Other energetic chloride ions may diffuse toward the neutralizer 76', as described previously, to neutralize the chloride ions and further emit energetic electrons into the second plasma 60'. Neutral chlorine atoms, energetic electrons, and ion current may participate in the chemical processing of the substrate 52' in manner similar to what was described above with reference to FIG. 2.

Figure 4:
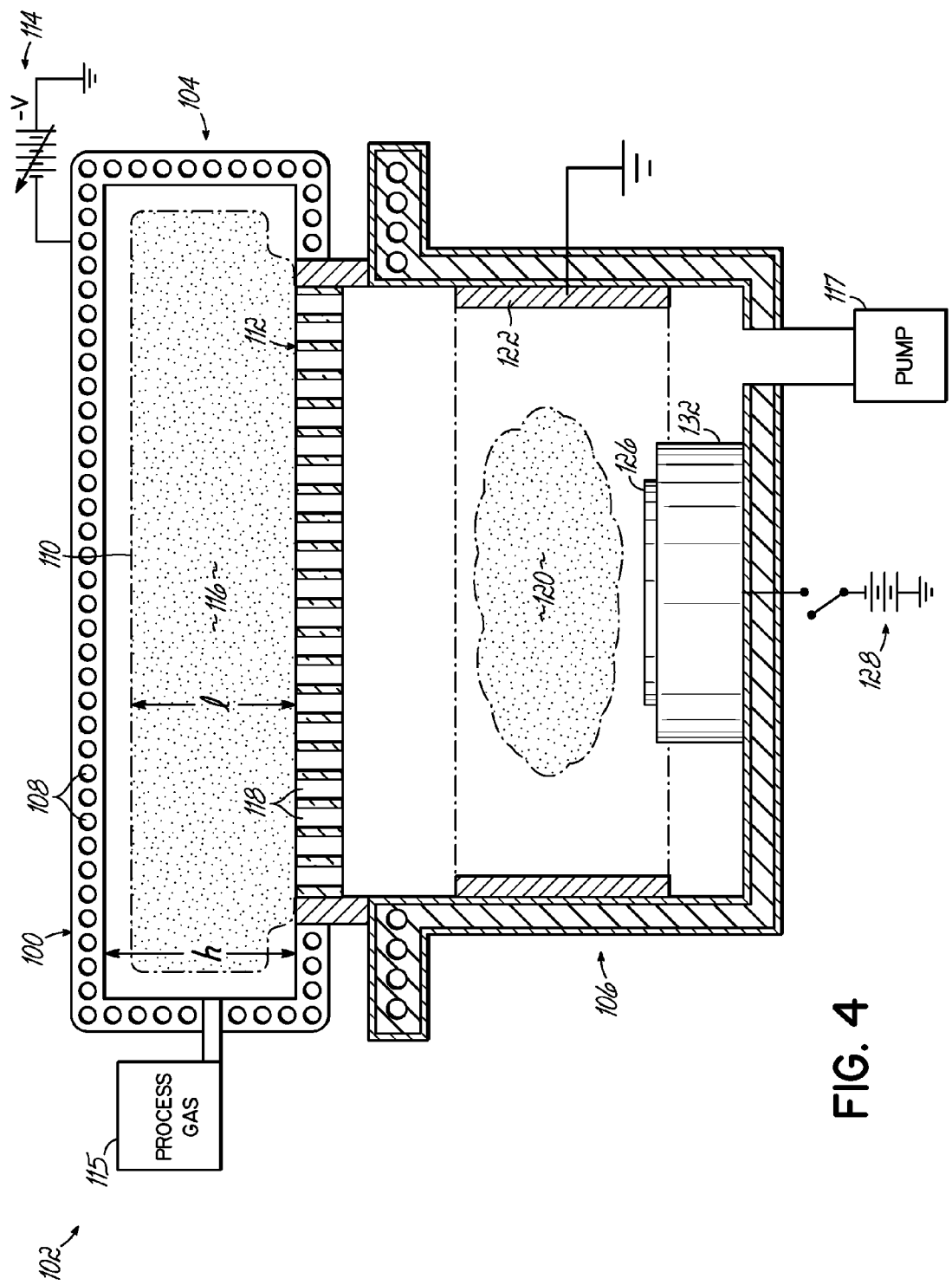
FIG. 4 illustrates a schematic view of a chemical processing system including a hollow cathode and in accordance with another embodiment of the present invention.

Turning now to FIG. 4, a hollow cathode plasma source 100 (hereafter "hollow cathode") for use in a surface emitted negative ion neutral beam chemical processing system 102 is shown and described in accordance with one embodiment of the present invention. The chemical processing system 102 may be somewhat analogous to the chemical processing system 50 (FIG. 1) described above in that the chemical processing system 102 includes a first plasma chamber 104 and a second plasma chamber 106. However, in the instant embodiment, a top portion of the first plasma chamber 104 includes, at least partially, the hollow cathode 100.

Generally, the hollow cathode 100 may be a DC conductive electrode that, for example and as described in detail above, may be constructed from a highly doped silicon material or as aluminum cathode. Alternatively still, the DC conductive electrode may comprise hafnium, copper, graphite, a thermal paralytic graphite, or other materials known to those of ordinary skill in the art. The hollow cathode 100 may be cooled, such as a by a plurality of cooling channels 108 configured to received a coolant, to a temperature that ranges from about 195° C. to about 0° C. In the case of very low temperatures, a cryogenic coolant may be used, such as liquid nitrogen. The hollow cathode 100 may be grounded via a DC voltage source 114.

A process gas system 115 is operable to inject process gases into the hollow cathode 100 for plasma formation. The process gas system 115 may further include high electron affinity species in accordance with embodiments of the present invention. A pump 117 may also be coupled to the chemical processing system 102 for drawing a vacuum and evacuating chemicals from the first and second chambers 104, 106.

Turning now to the details of the hollow cathode 100, the dimensions may be based, in part, in relation to a plasma sheath 110. For instance, a height, h, of the hollow cathode 100 is selected such that a distance between a dielectric neutralizer 112 and the plasma sheath 110, 1, is much less than the ionization mfp of the selected high electron affinity species such that the surface emitted ion (e.g., O$^-$ of FIG. 2 or Cl⁻ of FIG. 3, above) may cross the first plasma 116 to the dielectric neutralizer 112 without suffering a statistical gas-phase collision.

The dielectric neutralizer 112 may be manufactured in a manner that is similar to the neutralizer 76 (FIG. 2). That is, the dielectric neutralizer 112 may comprise a plurality of openings 118 to permit passage of the electric electron flux while being less than the mfp of the surface emitted ions so as to neutralize the surface emitted ions and release an energetic electron flux and a flux of neutral atoms into the second plasma 120 within the second plasma chamber 106. In that regard, the dielectric neutralizer 112 may be electrically floating with a high RF impedance to ground.

Turning now to the second plasma chamber 106 the total energetic electron flux into the second plasma chamber 104 is much greater in the chemical processing system 102 according to this illustrative embodiment than the energetic electron flux produced by a conventional, argon-based plasma process. This increased energetic electron flux is also configured to initiate and sustain the second plasma 120 within the second plasma chamber 106 at lower potential differences, $\Delta V$, as compared to the known, conventional systems.

Accordingly, a mono-energetic space-charged neutralized beam may be generated in the second plasma chamber 106.

Thermal electrons may be generated within the second plasma chamber 106 when the second plasma 120 is ionized by the incoming energetic electron flux (or electron current) or when at least some of the energetic electrons, experience a loss of energy. Because of Debye shielding, thermal electrons diffuse toward the conductive, grounded electrode 122 as a thermal electron current, and generate a quiescent plasma zone proximate the electrode 122.

While the thermal electrons are diffusing toward the grounded electrode 122, a second population of ions formed by the second plasma 120 is directed to the substrate 126 as ion current. These ions, along with the energetic electrons, participate in the chemical reaction, deposition, and/or etching at the substrate 126.

In using the chemical processing system 102 in accordance with one embodiment of the present invention, at a particular time interval, such as in accordance with a desired waveform, the relay circuit 128 coupled to electrode associated with the substrate holder 132 is switched so as to apply a pulsed DC bias to the substrate 126. For example, a pulsed negative bias may be applied to the substrate 126 during which positive ions are drawn toward the substrate 126. Pulsed periods of less negative bias (even positive bias) applied to the substrate 126 between the intervals of negative bias draws at least a portion of the energetic electrons from the second plasma 120 toward the substrate 126. As a result, the DC pulse bias achieves a mono-energetic ion excitation of the substrate 126 during the negative bias and an energetic electron dump via a more positive bias onto the substrate 126 to neutralize positive charge accumulation on the substrate 126.

While the present invention has been illustrated by description of various embodiments and while those embodiments have been described in considerable detail, those skilled in the art will readily appreciate that many modifications are possible in the exemplary embodiment without materially departing from the novel teachings and advantages of this invention. The invention in its broader aspects is therefore not limited to the specific details and illustrative examples shown and described. Accordingly, departures may be made from such details without departing from the spirit or scope of the present invention.

What is claimed is:

1. A method of processing a substrate with a plasma in the presence of an electro-negative gas, comprising:
   injecting a processing gas that includes a gas species selected from the group consisting of $Cl_2$, $F_2$, $Br_2$, $SiCl_4$, and $SiF_4$ into a plasma chamber;
   exposing the gas species in the plasma chamber to a surface to chemisorb the gas species onto the surface;
   igniting a plasma in the plasma chamber;
   exposing the surface to energy to cause the emission of negative ions from chemisorbed gas species into the plasma; and
   processing the substrate using the plasma.

2. The method of claim 1 further comprising:
   igniting the plasma by applying a pulsed RF signal to an electrode operably coupled to the plasma chamber to form a pulsed plasma.

3. The method of claim 1 further comprising:
   applying a pulsed voltage to the substrate that alternates the bias of the substrate between a negative bias voltage level and a less negative or positive bias voltage level.

4. The method of claim 1 wherein:
   the exposing of the surface includes applying a time average negative potential on the surface.

5. The method of claim 2, wherein:
   the exposing of the surface includes impacting the surface with radiation from the pulsed plasma to release negative ions of the gas species into the pulsed plasma and interacting the negative ions with a non-ionized portion of the processing gas to emit energized electrons.

6. The method of claim 5, wherein the interacting includes neutralizing the negative ions to emit energized electrons.

7. The method of claim 6 further comprising:
   energizing a second plasma with the emitted energized electrons.

8. The method of claim 7, further comprising:
   exposing the substrate to the second plasma;
   applying a pulsed DC bias to the substrate positioned on a substrate support in the plasma chamber; and
   periodically biasing the substrate positioned on the substrate support between first and second bias levels, the first bias level being more negative than the second bias level,
   wherein the substrate and the substrate support, when biased at the first bias level, attract mono-energetic positive ions from the plasma toward the substrate and are operable to enhance a selected chemical etch process at a surface of the substrate.

9. The method of claim 2, further comprising:
   increasing an electron density of the pulsed plasma by emitting negative ions from a secondary electron source that are reactive to a non-ionized portion of the processing gas.

10. The method of claim 9, further comprising:
    neutralizing negative ions to emit energized electrons.

11. The method of claim 10, further comprising:
    energizing a secondary plasma in a portion of the plasma chamber between the plasma and the substrate with the emitted energized electrons.

12. The method of claim 11, further comprising:
    positioning the substrate on a substrate support and applying a pulsed DC bias to the substrate on the substrate support; and
    periodically biasing the substrate between first and second bias levels, the first bias level being more negative than the second bias level, wherein the substrate, when biased at the first bias level, attracts mono-energetic positive ions from the pulsed plasma toward the substrate.

13. The method of claim 1, wherein:
the exposing of the gas species and the igniting of the plasma are carried out in a first plasma sub-chamber within the plasma chamber having a said surface therein, the ignited plasma being a primary plasma, the negative ions increasing an electron density in the primary plasma by being neutralized in the primary plasma to thereby emit energized secondary electrons; and
the processing of the substrate is carried out in a second plasma sub-chamber having the substrate therein by forming a secondary plasma in the second sub-chamber with the energized secondary electrons.

14. The method of claim 13, wherein the substrate is positioned on a substrate holder in the second plasma sub-chamber, the method further comprising:
applying a pulsed DC bias to the substrate positioned on the substrate holder; and
periodically biasing the substrate between first and second bias levels, the first bias level being more negative than the second bias level,
wherein the substrate, when biased at the first bias level, attracts mono-energetic positive ions from the plasma toward the substrate.

15. A method of processing a substrate with a plasma in the presence of an electro-negative gas, comprising:
injecting a processing gas that includes a first gas species and a second gas species of higher electron affinity than the first gas species into a plasma chamber;
chemisorbing the second gas species onto a surface in the plasma chamber, wherein the surface is different than a surface of the substrate;
igniting a plasma in the plasma chamber;
exposing the surface to energy to cause the emission of negative ions from chemisorbed second gas species into the plasma; and
processing the substrate in the plasma chamber using the plasma containing the negative ions.

16. The method of claim 15 further comprising:
igniting the plasma by applying a pulsed RF signal to an electrode operably coupled to the plasma chamber to form a pulsed plasma.

17. The method of claim 15 further comprising:
applying a pulsed voltage to the substrate that alternates the bias of the substrate between a negative bias voltage level and a less negative or a positive bias voltage level.

18. The method of claim 15 wherein:
the exposing of the surface includes applying a time average negative potential on the surface.

19. The method of claim 16, wherein:
the exposing of the surface includes impacting the surface with radiation from the pulsed plasma to release negative ions of the gas species into the pulsed plasma and interacting the negative ions with a non-ionized portion of the processing gas to emit energized electrons.

20. The method of claim 19, wherein the interacting includes neutralizing the negative ions to emit energized electrons.

21. The method of claim 20 further comprising:
energizing a second plasma with the emitted energized electrons.

22. The method of claim 21, further comprising:
exposing the substrate to the second plasma;
applying a pulsed DC bias to the substrate positioned on a substrate support in the plasma chamber; and
periodically biasing the substrate positioned on the substrate support between first and second bias levels, the first bias level being more negative than the second bias level,
wherein the substrate and the substrate support, when biased at the first bias level, attract mono-energetic positive ions from the plasma toward the substrate and are operable to enhance a selected chemical etch process at a surface of the substrate.

23. The method of claim 16, further comprising:
increasing an electron density of the pulsed plasma by emitting negative ions from a secondary electron source that are reactive to a non-ionized portion of the processing gas.

24. The method of claim 23, further comprising:
neutralizing the negative ions to emit energized electrons.

25. The method of claim 24, further comprising:
energizing a secondary plasma in a portion of the plasma chamber between the plasma and the substrate with the emitted energized electrons.

26. The method of claim 25, further comprising:
positioning the substrate on a substrate support and applying a pulsed DC bias to the substrate on the substrate support; and
periodically biasing the substrate between first and second bias levels, the first bias level being more negative than the second bias level,
wherein the substrate, when biased at the first bias level, attracts mono-energetic positive ions from the pulsed plasma toward the substrate.

27. The method of claim 15, wherein:
the chemisorbing the second gas species and the igniting of the plasma are carried out in a first plasma sub-chamber within the plasma chamber having the surface therein, the ignited plasma being a primary plasma, the negative ions increasing an electron density in the primary plasma by being neutralized in the primary plasma to thereby emit energized secondary electrons; and
the processing of the substrate is carried out in a second plasma sub-chamber having the substrate therein by forming a secondary plasma in the second sub-chamber with the energized secondary electrons.

28. The method of claim 27, wherein the substrate is positioned on a substrate holder in the second plasma sub-chamber, the method further comprising:
applying a pulsed DC bias to the substrate positioned on the substrate holder; and
periodically biasing the substrate between first and second bias levels, the first bias level being more negative than the second bias level,
wherein the substrate, when biased at the first bias level, attracts mono-energetic positive ions from the plasma toward the substrate.

* * * * *